US 9,520,869 B2

(12) United States Patent
Fiedorow et al.

(10) Patent No.: US 9,520,869 B2
(45) Date of Patent: Dec. 13, 2016

(54) ANALOG MULTIPLEXER

(71) Applicant: STMicroelectronics (Grenoble 2) SAS, Grenoble (FR)

(72) Inventors: Pawel Fiedorow, Grenoble (FR); Thierry Masson, Varces (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/837,279

(22) Filed: Aug. 27, 2015

(65) Prior Publication Data

US 2016/0173079 A1      Jun. 16, 2016

(30) Foreign Application Priority Data

Dec. 12, 2014   (FR) ...................................... 14 62317

(51) Int. Cl.
*H03K 17/00*       (2006.01)
*H03K 17/16*       (2006.01)
*H03K 17/687*      (2006.01)
*H03K 17/693*      (2006.01)
*H03K 17/10*       (2006.01)
*H03K 17/06*       (2006.01)

(52) U.S. Cl.
CPC .......... *H03K 17/162* (2013.01); *H03K 17/005* (2013.01); *H03K 17/102* (2013.01); *H03K 17/6872* (2013.01); *H03K 17/693* (2013.01); *H03K 2017/066* (2013.01); *H03K 2217/0009* (2013.01); *H03K 2217/0036* (2013.01); *H03K 2217/0054* (2013.01)

(58) Field of Classification Search
None
See application file for complete search history.

(56) References Cited

U.S. PATENT DOCUMENTS 6,509,860 B2 *   1/2003   Saito .................. H03K 17/6872
                                                            327/403
6,538,867 B1     3/2003   Goodell et al.
(Continued)

FOREIGN PATENT DOCUMENTS

EP          1024596 A1       8/2000

OTHER PUBLICATIONS

Koichi Ishida et al: "Managing Leakage in Charge Based Analog Circuits With Low VTH Transistors by Analog T-Switch (AT-Switch) and Super Cut-Off CMOS," Jun. 16, 2005, Symposium on VLSI Circuits Digest of Technical Papers Internet Extract URL: http://ieeexplore.ieee.org/ielx5/9912/31517/01469348.pdf?tp=&arnumber=1469348&isnumber=31517.

*Primary Examiner* — Long Nguyen
(74) *Attorney, Agent, or Firm* — Gardere Wynne Sewell, LLP

(57) ABSTRACT

A switching circuit a multiplexer includes an NMOS switch module and a PMOS switch module connected in parallel between an input and an output. A first control module powered from a first power supply voltage operates to reduce leakage currents of the NMOS switching module when in the non-conducting state. A second control module powered from a second power supply voltage operates to reduce leakage currents of the PMOS switching module when in the non-conducting state. A voltage selection circuit is configured to deliver a voltage as the second power supply voltage equal to the greater of the first power supply voltage and the voltages present at the input and at the output.

19 Claims, 3 Drawing Sheets

(56) References Cited

U.S. PATENT DOCUMENTS

| | | |
|---|---|---|
| 2002/0041198 A1 | 4/2002 | Parris et al. |
| 2005/0057283 A1 | 3/2005 | Ranganathan |
| 2006/0028262 A1* | 2/2006 | Grimone, III ..... H03K 17/6872 327/427 |
| 2007/0285149 A1* | 12/2007 | Nakatani ................ G11C 27/02 327/427 |
| 2008/0231341 A1 | 9/2008 | Miske |

* cited by examiner

ANALOG MULTIPLEXER

PRIORITY CLAIM

This application claims priority from French Application for Patent No. 1462317 filed Dec. 12, 2014, the disclosure of which is incorporated by reference.

TECHNICAL FIELD

Various embodiments of the invention relate to analog multiplexers, and, more precisely, the analog multiplexers capable of allowing high voltage signals to be switched with low control voltages, while at the same time being compatible with a mode referred to as "cold spare" according to a terminology well known to those skilled in the art.

BACKGROUND

Generally speaking, an analog multiplexer comprises several channels respectively connecting several inputs to one output.

Each channel generally comprises a controllable CMOS circuit.

When the multiplexer is powered, one of the channels is selected for transmitting the signal present at the corresponding input to the output.

When the multiplexer is in the "cold spare" mode, it is not powered and it is capable of replacing another multiplexer to which it is connected in the case where this other multiplexer is defective.

However, in "cold spare" mode, the multiplexer must not interfere with the operation of the other multiplexer, notably in terms of current consumption.

SUMMARY

According to one embodiment, an analog multiplexer is provided whose gate-source and substrate-source voltages of the analog switches are controlled in such a manner as to ensure the linearity and the operation of the switches over the whole range of the input and output signals and to reduce as far as possible the leakage currents of the analog switches when the latter are in their non-conducting state.

According to one embodiment, an analog multiplexer is also provided whose high-voltage analog switches are compatible with a low-voltage control technology.

According to another embodiment, an analog multiplexer is furthermore provided that is compatible with the mode referred to as "cold spare".

Thus, according to one aspect, an analog multiplexer is provided comprising several inputs and one output and several switching circuits respectively connected between the inputs and the output.

According to one general feature of this aspect, each switching circuit comprises:

a first switching module of the NMOS type having a conducting state and a non-conducting state,
a second switching module of the PMOS type having a conducting state and a non-conducting state, the first and second switching modules being connected in parallel between the corresponding input and the output,
a first control module designed to be powered by a first power supply voltage and configured for reducing the leakage currents of the first switching module when the first switching module is in its non-conducting state, and
a second control module designed to be powered by a second power supply voltage and configured for reducing the leakage currents of the second switching module when the second switching module is in its non-conducting state.

Furthermore, the multiplexer comprises at least one voltage selection circuit configured for delivering the second power supply voltage which is equal to the greatest of the first power supply voltage and of the voltages present at the input and at the output.

This voltage selector circuit contributes to the correct operation of the switching circuit in a normal mode of operation (multiplexer powered) or else in a "cold spare" mode.

In order to be compatible with the mode referred to as "cold spare", the first control module and the second control module are furthermore advantageously configured in such a manner that, when the first power supply voltage is zero, the two switching modules are turned off and the current consumption on the input and on the output is zero or virtually so (ignoring any leakages) and, in practice, less than a given threshold.

This threshold depends essentially on the technology used and on the geometry of the transistors and is advantageously determined by those skilled in the art such that the unpowered multiplexer (in "cold spare" mode) does not interfere with the normal operation of another multiplexer to which it is connected. This threshold may for example be of the order of 0.1% of a normal current consumption in the presence of the first non-zero power supply voltage.

By way of example, this threshold can be of the order of 0.1 µA.

The first switching module may advantageously comprise two NMOS extended-drain transistors connected in series between the input and the output and having their sources and substrates mutually connected.

Such a configuration is commonly denoted by those skilled in the art by the term "back-to-back switch" which allows the gate-source voltage of the two NMOS extended-drain transistors to be completely controlled.

In the same way, the second switching module can comprise two PMOS extended-drain transistors connected in series between the input and the output and having their sources and substrates mutually connected.

Advantageously, the use of the two switching modules, respectively of the NMOS type and of the PMOS type, connected in parallel between the input and the output, allows the whole dynamic range of the input and output signals to be covered.

Furthermore, as the input and the output are connected to the drains of the NMOS and PMOS extended-drain transistors, higher input and output impedances can be obtained.

According to one embodiment, the first control module comprises a first control block controllable by a first binary control signal and configured for, when the first binary control signal has a first logical value, grounding the gates and the substrates of the NMOS transistors of the first switching module so as to place it in its non-conducting state.

The first control module can furthermore comprise a first input block connected to the corresponding input and configured for, when the first binary control signal has its second logical value corresponding to a conducting state of the first switching module, feedback controlling the gate voltages of the NMOS transistors of the first switching module to the voltage present at the input and limiting these gate voltages to the first power supply voltage.

According to another embodiment, the second control module is controllable by a second binary control signal, advantageously complementary to the first binary signal, and configured for, when the second binary control signal has a first logical value, grounding the second power supply voltage, the gates and the substrates of the PMOS transistors of the second switching module so as to place it in its non-conducting state.

The second control module can furthermore be configured for, when the second binary control signal has its second logical value corresponding to a conducting state of the second switching module, leaving the sources and substrates of the PMOS transistors of the second switching module floating and applying to the gates of these PMOS transistors of the second switching module a gate voltage close to the first power supply voltage.

According to yet another embodiment, the voltage selection circuit of the analog multiplexer comprises an additional PMOS extended-drain transistor whose gate is connected to its source via a resistance and powered by a current source, the source of the additional transistor being connected to the input and to the output via reverse-biased diodes, the source being designed to deliver the second power supply voltage.

The analog multiplexer is advantageously fabricated in an integrated manner.

BRIEF DESCRIPTION OF THE DRAWINGS

Other advantages and features of the invention will become apparent upon studying the detailed description of embodiments, taken by way of non-limiting examples and illustrated by the appended drawing in which.

DETAILED DESCRIPTION

Figure 1:
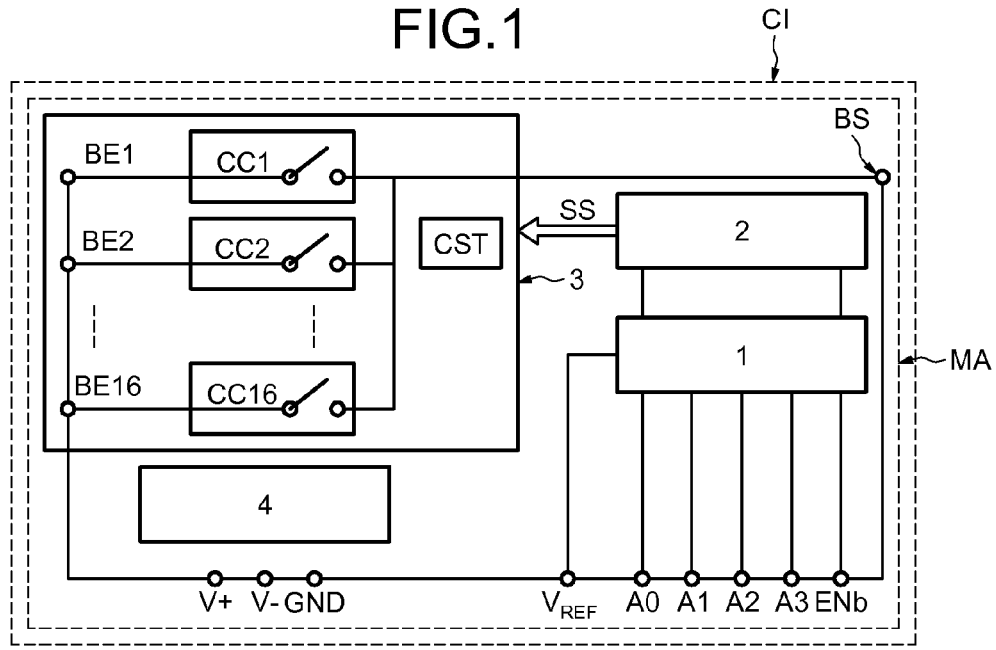
FIG. 1 shows a block diagram of one example of an analog multiplexer.

FIG. 1 shows a diagram of the various stages of an analog multiplexer MA, for example with 16 channels, incorporated within an integrated circuit CI.

The multiplexer comprises a switching stage 3. The switching stage 3 contains several switching circuits CCi associated with the corresponding channels, for example 16 switching circuits CC1 to CC16, and connected between several inputs BE1 to BE16 and one output BS.

Depending on a selection signal SS applied to the corresponding channel, the corresponding switching circuit is conducting for transmitting the input signal of the corresponding channel to the output of the analog multiplexer, or else is turned off.

A level 1 addressing and conversion input stage receives the digital address A0 to A3 of a channel to be processed, an enable signal ENb and a reference signal $V_{REF}$ at its inputs. The enable signal is subsequently converted into the selection signal SS.

A decoding stage 2 subsequently transmits the selection signal SS to the corresponding analog switching circuit of the channel to be processed as a function of the digital address received from the preceding stage.

Advantageously, the switching stage 3 also comprises a voltage selection circuit CST configured for ensuring the correct operation of the analog multiplexer notably in the mode referred to as "cold spare". The architecture and the operation of the voltage selection circuit CST will be detailed hereinafter.

The analog multiplexer furthermore possesses a protection stage 4 protecting the whole of the analog multiplexer against possible electrostatic discharges.

As all the switching circuits CC1 to CC16 situated within the switching stage 3 are identical, one of the switching circuits CCi will now be described with reference more particularly to FIGS. 2 to 3.

Figure 2:
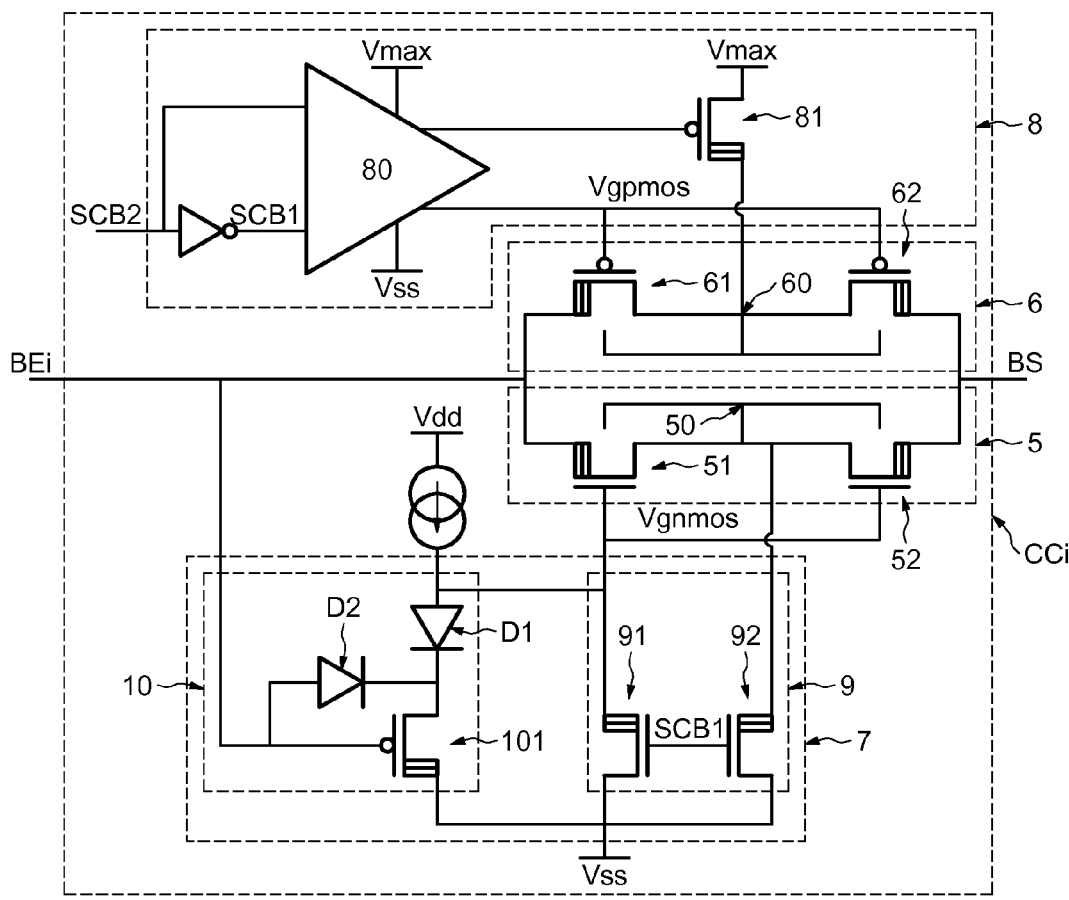
FIGS. 2 to 3 relate to various embodiments of an analog multiplexer.

As illustrated in FIG. 2, the switching circuit CCi comprises:

a first switching module of the NMOS type 5 having a conducting state and a non-conducting state, a second switching module of the PMOS type 6 having a conducting state and a non-conducting state, a first control module 7 dedicated to the first switching module of the NMOS type 5, and a second control module 8 dedicated to the second switching module of the PMOS type 6.

In fact, the selection signal SS here comprises a first binary control signal SCB1 and a second binary control signal SCB2. The two signals are complementary as will be seen in more detail hereinafter.

When the multiplexer is in a normal operation mode, in other words powered by the non-zero power supply voltage Vdd, and the first binary control signal SCB1 is in the low state and, consequently, the second binary signal SCB2 is in the high state, the switching circuit CCi is in its conducting state.

On the other hand, when the first binary control signal SCB1 is in the high state and, consequently, the second binary control signal SCB2 is in the low state, the switching circuit CCi is in its non-conducting state.

The two switching modules 5 and 6 are connected in parallel between the corresponding input BEi and the output BS. This structure having on one side a NMOS switch and on the other a PMOS switch advantageously allows the operation of the switching circuit CCi to be guaranteed over the whole dynamic range of the input signals.

The first switching module 5 comprises two NMOS extended-drain transistors 51 and 52, with a conventional structure known per se, connected in series between the input BEi and the output BS. The sources and substrates of the two NMOS transistors 51 and 52 are connected together.

In an analogous manner, the second switching module 6 comprises two PMOS extended-drain transistors 61 and 62 connected in series between the input BEi and the output BS and having their sources and substrates mutually connected.

Thus, the switching module is able to withstand high voltage input and output signals, for example up to 16 V.

The use of the extended-drain transistors 51, 52, 61 and 62 allows such high-voltage input signals (for example up to 16 volts) to be handled while at the same time using a low-voltage technology for supplying the gates of these transistors (typically of the order of a few volts).

The input and output impedances are also high since the corresponding input and the output of the switching module are connected to the drains of the extended-drain transistors.

Furthermore, as the sources and substrates of these extended-drain transistors 51, 52, 61 and 62 of each switching module are mutually connected to an internal node 50 and 60 (a configuration commonly denoted by those skilled in the art by the term "back-to-back switch"), the gate-source and substrate-source voltages of the extended-drain transistors can be controlled, which allows a high linearity to be obtained for the switching modules and the leakage currents to be reduced as much as possible when the switching modules are in their non-conducting state, as will be seen in more detail hereinafter.

The first control module 7 shown in FIG. 2 comprises a first control block 9, controllable by the first binary control signal SCB1 and comprising two auxiliary NMOS extended-drain transistors with 91 and 92. The drain of the auxiliary NMOS transistor 91 is connected to the gates of the two NMOS extended-drain transistors 51 and 52 of the first switching module 5. The drain of the auxiliary NMOS transistor 92 is connected to the sources and substrates of the two NMOS extended-drain transistors 51 and 52 of the first switching module 5. The gates of the auxiliary transistors NMOS 91 and 92 are controllable by the first binary control signal SCB1 and the sources of these auxiliary transistors are connected to ground Vss.

When the first binary control signal SCB1 has a first logical value, for example 3.3 V (high state), the auxiliary transistors NMOS 91 and 92 are in their conducting state and the gates and the substrates of the NMOS transistors 51 and 52 of the first switching module 5 are therefore grounded Vss. As a consequence, the NMOS transistors 51 and 52 of the first switching module 5 are turned off and the first switching module 5 is then placed in a non-conducting state. The leakage currents are advantageously limited owing to the fact that the gates, sources and substrates of the NMOS 51 and 52 are grounded.

The first control module 7 furthermore comprises a first input block 10 comprising a PMOS extended-drain transistor 101 connected in follower mode whose gate is connected to the corresponding input BEi. Its drain is connected to ground Vss and its source is connected to the gates of the NMOS transistors 51 and 52 through a first high-voltage diode D1 and to the first power supply voltage Vdd through a current source.

A second high-voltage diode D2 is connected between the source and the gate of the PMOS transistor 101. The two diodes D1 and D2 are intended to provide a protection for the transistor 101 and also an additional protection for the transistors 51 and 52.

When the first binary control signal SCB1 has its second logical value, for example 0V (low state), the transistors 91 and 92 are turned off. The voltage Vgnmos on the gates of the NMOS transistors 51 and 52 is equal to the difference between the voltage of the input signal and the threshold voltage of the PMOS transistor 101. The first switching module of the NMOS type 5 is therefore able to be in a conducting state.

Nevertheless, the voltage Vgnmos is also limited by the power supply voltage Vdd. If the voltage of the input signal is close to the voltage Vdd, the voltage Vgnmos will not be high enough for the NMOS transistors 51 and 52 to effectively be in a conducting state. In this case, the first switching module 5 is in its non-conducting state and cannot transmit the input signal to the output. The signal will then be transmitted by the second switching module 6.

The architecture of the second control module 8 is now described which module is controllable by the second binary control signal SCB2 being complementary to the first binary control signal SCB1.

The second control module 8 is powered by a second power supply voltage Vmax which is delivered by the voltage selection circuit CST and which, as will be seen hereinafter, is equal to the highest of the voltage Vdd and of the voltages present on the terminals BEi and BS (Vmax=Max ($V_{BEi}$, $V_{BS}$, Vdd)).

When the multiplexer is in a normal operation mode, in other words powered by the non-zero power supply voltage Vdd, the voltage Vmax is equal to Vdd.

The second control module 8 comprises a comparator 80 whose two inputs are respectively coupled to the first and second binary control signals SCB1 and SCB2. The terminal of input noninverting (positive) is connected to the second power supply voltage Vmax. The terminal of input inverting (negative) is connected to the ground Vss.

A first output of the comparator 80 is connected to the gate of a control transistor PMOS 81 with extended drain whose source is connected to the second power supply voltage Vmax and whose drain is connected to sources and substrates of the two PMOS extended-drain transistors 61 and 62 of the second switching module 6.

A second output of the comparator 80 is coupled to the gates of the two PMOS transistors 61 and 62 of the second switching module 6.

When the second control signal SCB2 has a first logical value, for example 0 V, the voltage Vgpmos of the gates of the two PMOS transistors 61 and 62 is equal to the second power supply voltage Vmax and the voltage of the gate of the control transistor 81 equal to a static voltage for example equal to 12 V.

This static voltage is chosen so that, when the signal SCB2 is in a high state, the transistors 61 and 62 are conducting for input signals close to the power supply voltage Vdd and so that the gate-source voltages of the PMOS transistors 61 and 62 do not exceed a fixed limit, for example 4.8 V.

Since Vmax is here equal to Vdd, for example 16 V, the control transistor 81 is therefore in a conducting state and the voltage on the sources and on the substrates of the two PMOS transistors 61 and 62 are driven to the second power supply voltage Vmax.

As the voltage Vgpmos on the gates of the two PMOS transistors 61 and 62 is also equal to the second power supply voltage Vmax, the second switching module of the PMOS type 6 is in a non-conducting state and the leakage currents are minimized owing to the fact that the gate, source and substrate voltages of the PMOS transistors 61 and 62 are driven to Vdd.

When the second binary control signal SCB2 switches to its second logical value (high state), for example 3.3 V, the voltage Vgpmos is equal to 12 V and the gate voltage of the control transistor 81 is equal to the second power supply voltage Vmax (Vdd). Under these circumstances, the control transistor 81 is in a non-conducting state.

As a consequence, the sources and substrates of the PMOS transistors 61 and 62 of the second switching module 6 are rendered floating and the second switching module of the PMOS type 6 is able to adopt a conducting state.

In fact, the second switching module of the PMOS type 6 is only really conducting when the voltages of the input signals exceed the sum of the static voltage (12V) and the threshold voltage of the PMOS transistors 61 and 62 of the second switching module 6.

The second switching module 6 is thus configured to take over from the first switching module 5 when the voltages of the input signals are close to the first power supply voltage Vdd, typically for signals in the range between around 13 volts and Vdd (16 volts).

Thus, depending on the voltage of the input signal, when the signals SCB1 and SCB2 respectively adopt their low and high logical states, either one of the two switching modules 5 and 6 is conducting or off and the other off or conducting, or the two switching modules are conducting.

In the majority of cases, the first power supply voltage Vdd is higher than those of the input and output signals.

However, when the analog multiplexer is in a mode referred to as "cold spare" and completely off, the first power supply voltage Vdd is equal to zero. The voltages of the input and output signals may then be higher than Vdd.

Figure 3:
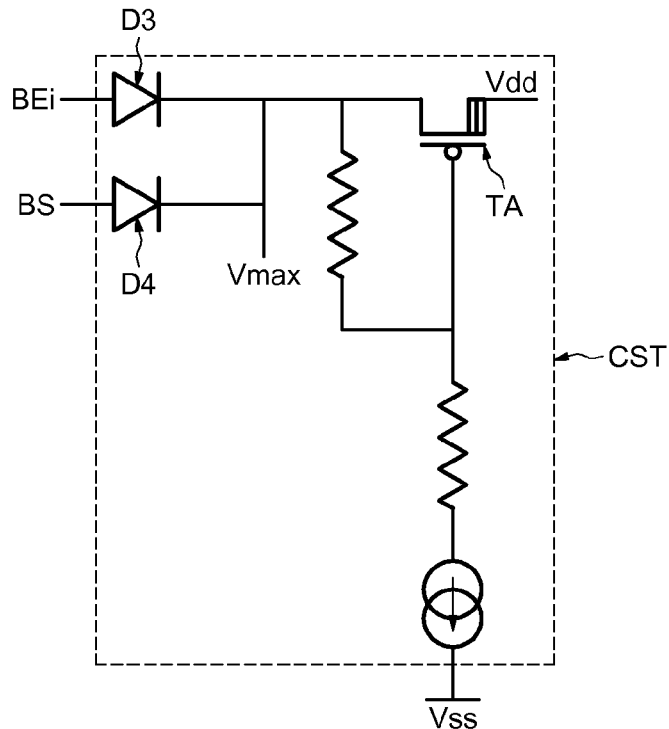

In order to ensure the operation of the second switching module of the PMOS type 6, the switching stage 3 furthermore comprises at least one voltage selection circuit CST such as that illustrated in FIG. 3.

The voltage selection circuit CST here comprises an additional PMOS extended-drain transistor TA whose gate is connected to its source via a resistor and powered by a current source.

The source of the additional transistor TA is connected to all the inputs BEi and to the output BS of the switching stage 3 via reverse-biased diodes D3 and D4. The source of the additional transistor TA is designed to deliver the second power supply voltage Vmax.

As has been explained hereinbefore, when the power supply voltage Vdd is higher than the higher of the corresponding input and output signals, the additional PMOS transistor TA operates as a switch and there is no voltage drop between its drain and its source. The second power supply voltage Vmax is then equal to Vdd.

In "cold spare" mode, the power supply voltage Vdd is equal to 0 and the current source is therefore in OFF mode. The second power supply voltage Vmax is then equal to the higher voltage of the input voltage present on the corresponding input BEi and of the output voltage reduced by the threshold voltage of the diode D3 or D4.

Thus, the highest voltage from amongst the first power supply voltage Vdd and the voltages of the input and output signals is always selected by this voltage selection circuit CST.

Figure 4:
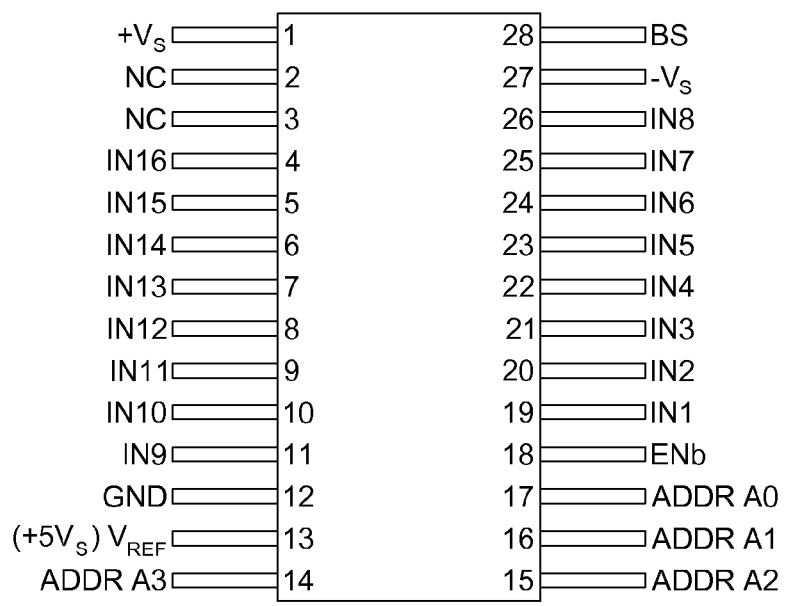
FIGS. 4 to 5 relate to a diagram showing the assignment of the pins of an analog multiplexer and to a mode of operation referred to as "cold spare".
Figure 5:
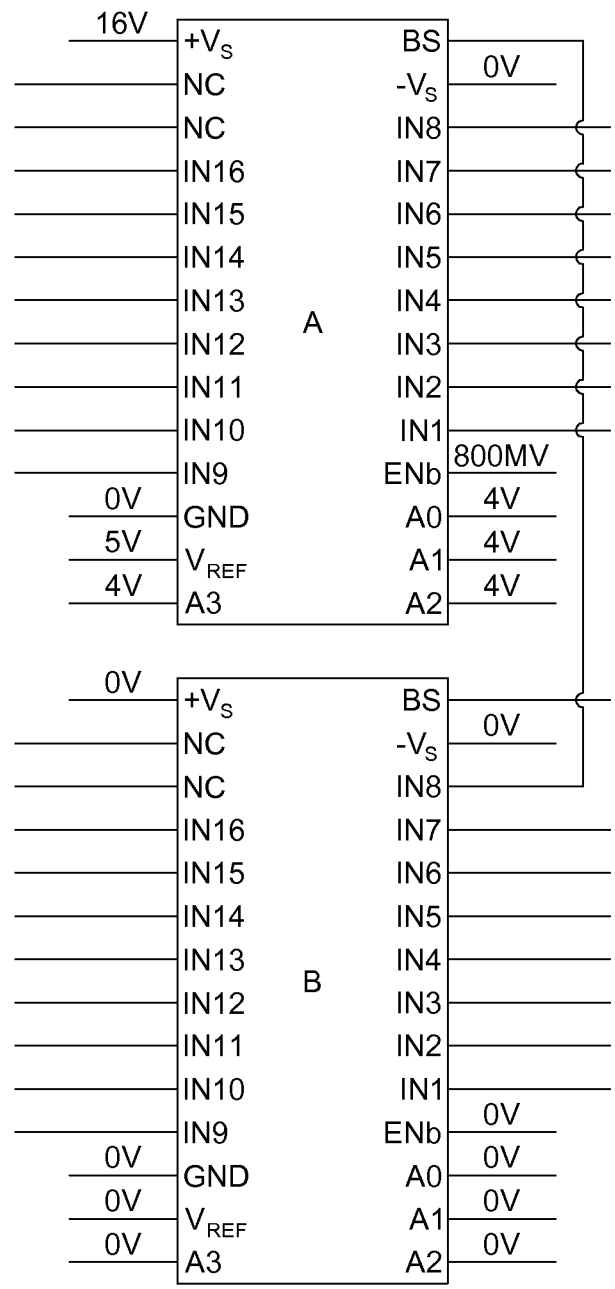

Reference is now made to FIGS. 4 to 5 in order to illustrate a diagram of allocation of the pins of the analog multiplexer and one embodiment of the two analog multiplexers in a mode referred to as "cold spare".

FIG. 4 indeed illustrates a diagram of assignment of the pins of the analog multiplexer which has just been described having 16 inputs IN1 to IN16 (corresponding to the 16 terminals BE1 to BE16 in FIG. 1) and one output. The pins ADDR A0 to A3 are configured for receiving the digital address of the channel to be processed and the pin ENb allows the multiplexer to be enabled. There are also the pins associated with the power supply voltage signals such as +Vs, −Vs, $V_{REF}$ and GND.

The mode of the analog multiplexer B is illustrated referred to as "cold spare" in FIG. 5.

In this figure, an analog multiplexer A is in operation and powered by the first power supply voltage (Vdd=16 V) and the analog multiplexer B is completely switched off (Vdd=0 V, $V_{ENb}$=0 V).

Under these circumstances, the two binary control signals SCB1 and SCB2 are also at 0 V. As a consequence, the second switching module of the PMOS type 6 of the multiplexer B is in its non-conducting state. As far as the first switching module of the NMOS type 5 is concerned, since the power supply voltage Vdd is equal to 0V, it is also in its non-conducting state.

Furthermore, the leakage currents are indeed reduced by virtue of the control of the gate-source and substrate-source voltages of the transistors 51, 52, 61 and 62 of the two switching modules 5 and 6, and, as far as the PMOS switching module 6 is concerned, by virtue of the voltage selection circuit CST which imposes Vmax=Max ($V_{BEi}$, $V_{BS}$, Vdd=0).

Consequently, if the multiplexer A delivers a signal to the multiplexer B which is completely switched off, the internal components of the multiplexer B will not be destroyed.

Furthermore, since Vmax=Max ($V_{BEi}$, $V_{BS}$, Vdd=0), and the sources and substrates of the PMOS transistors 61 and 62 of the multiplexer B are driven to Vmax and the transistors 51 and 52 are turned off, even if a voltage is present on one of the inputs BEi or on the output BS of the multiplexer B owing to a connection with a pin of the multiplexer A, the current consumption at the input and on the output of the multiplexer B is zero not counting any leakages, in other words less than a defined threshold for example of the order of 0.1% of a normal current consumption in the presence of Vdd (16V).

The analog multiplexer B in a mode referred to as "cold spare" will not therefore interfere with the normal operation of the analog multiplexer A.

It should be noted that the outputs of the analog multiplexers are bidirectional. One of the inputs or the output of the multiplexer A could be coupled with the output of the multiplexer B and vice versa.

It is thus possible, according to one aspect of the invention, for a high-voltage analog multiplexer to be obtained that can be implemented with a low-voltage control technology, compatible with the "cold spare" mode and having a good linearity of the switching modules over the whole dynamic range of the signals by virtue notably of the control of the gate-source voltage of the transistors of these switching modules.

The invention is not limited to the embodiments that have just been described but also encompasses all the variants of these.

Thus, although only one voltage selection circuit CST connected to all the inputs has been described, it would be possible to provide several identical voltage selection circuits respectively assigned to several groups of inputs.

The invention claimed is:

1. A circuit, comprising:
    several inputs and one output;
    several switching circuits respectively connected between the inputs and the output,
    wherein each switching circuit comprises:
    a first switching module of the NMOS type having a conducting state and a non-conducting state; and
    a second switching module of the PMOS type having a conducting state and a non-conducting state;
    the first and second switching modules connected in parallel between the corresponding input and the output;
    a first control module powered by a first power supply voltage and configured to reduce leakage currents of the first switching module when the first switching module is in the non-conducting state; and
    a second control module powered by a second power supply voltage and configured to reducing leakage currents of the second switching module when the second switching module is in the non-conducting state; and
    wherein the circuit further comprises at least one voltage selection circuit configured to deliver the second power supply voltage equal to a greater one of the first power supply voltage and of the voltages present at the input and at the output.

2. The circuit according to claim 1, wherein the first control module and the second control module are further configured, when the first power supply voltage (Vdd) is zero, to cause the first and second switching modules to be turned off, with current consumption at the input and at the output to be zero or virtually zero.

3. The circuit according to claim 2, wherein, when the first power supply voltage is zero, the current consumption is less than a threshold of the order of 0.1% of a normal current consumption in the presence of a first non-zero power supply voltage.

4. The circuit according to claim 1,
wherein the first switching module comprises two NMOS extended-drain transistors connected in series between the input and the output and having sources and substrates of the two NMOS extended-drain transistors mutually connected, and
wherein the second switching module comprises two PMOS extended-drain transistors connected in series between the input and the output and having sources and substrates of the two PMOS extended-drain transistors mutually connected.

5. The circuit according to claim 4, wherein the first control module comprises a first control block controllable by a first binary control signal and configured, when the first binary control signal has a first logical value, to ground gates and substrates of the two NMOS transistors of the first switching module so as to place the first switching module in the non-conducting state.

6. The circuit according to claim 5, wherein the first control module further comprises a first input block connected to the corresponding input and configured, when the first binary control signal has a second logical value corresponding to the conducting state of the first switching module, to feed control gate voltages of the two NMOS transistors of the first switching module to the voltage present at the input and limit the gate voltages to the first power supply voltage.

7. The circuit according to claim 1, wherein the second control module is controllable by a second binary control signal and configured, when the second binary control signal has a first logical value, to bias with the second power supply voltage gates and the substrates of the two PMOS transistors of the second switching module so as to place the second switching module in the non-conducting state.

8. The circuit according to claim 7, wherein the second control module is further configured, when the second binary control signal has a second logical value corresponding to the conducting state of the second switching module, to leave the sources and substrates of the two PMOS transistors of the second switching module floating and apply to gates of the two PMOS transistors of the second switching module a gate voltage close to the first power supply voltage.

9. The circuit according claim 7, wherein the first control module comprises a first control block controllable by a first binary control signal, and wherein the first binary control signal and the second binary control signal are complementary signals.

10. The circuit according to claim 1, wherein the at least one voltage selection circuit comprises a PMOS extended-drain transistor having a gate connected to a source via a resistance and powered by a current source, with the drain connected to the first power supply voltage, the source of the PMOS extended-drain transistor being connected to the input and to the output via reverse-biased diodes, respectively, the source further configured to deliver the second power supply voltage.

11. The circuit according claim 1, implemented as an integrated circuit.

12. A circuit, comprising:
an NMOS switching module connected between an input and an output;
a PMOS switching module connected between the input and the output;
the NMOS and PMOS switching modules connected in parallel;
a first control module powered from a first power supply voltage node and configured to control a conducting state and a non-conducting state of the NMOS switching module;
a second control module powered from a second power supply voltage node and configured to control a conducting state and a non-conducting state of the PMOS switching module;
a voltage selection circuit configured to deliver a supply voltage to the second power supply voltage node equal to a greater one of the voltages at the first power supply voltage node, the input and the output.

13. The circuit according to claim 12, wherein the voltage selection circuit comprises:
a PMOS extended-drain transistor having a gate, a source and a drain, the drain connected to the first power supply node;
a current source coupled to the gate;
a first diode coupled between the input and the source;
a second diode coupled between the output and the source; and
wherein the source is coupled to the second power supply voltage node.

14. The circuit of claim 12, wherein the first control module is configured to reduce leakage currents of the NMOS switching module when the NMOS switching module is configured for operation in a non-conducting state between the input and output.

15. The circuit of claim 12, wherein the second control module is configured to reduce leakage currents of the PMOS switching module when the PMOS switching module is configured for operation in a non-conducting state between the input and output.

16. The circuit according to claim 12, wherein the first and second control modules are further configured, in response to a zero voltage at the first power supply voltage node, to cause the NMOS and PMOS switching modules to be turned off with zero current consumption at the input and output.

17. The circuit according to claim 12, wherein the first control module is further configured to limit gate voltages of NMOS transistors within the NMOS switching module to a voltage at the first power supply voltage node.

18. A circuit, comprising:
a plurality of inputs;
an output; and
a switching circuit coupled between each input and said output, wherein each switching circuit comprises:
an NMOS switching module connected between one of the inputs and the output;
a PMOS switching module connected between said one of the inputs and the output;
the NMOS and PMOS switching modules connected in parallel;

a first control module powered from a first power supply voltage node and configured to control a conducting state and a non-conducting state of the NMOS switching module;

a second control module powered from a second power supply voltage node and configured to control a conducting state and a non-conducting state of the PMOS switching module; and a voltage selection circuit configured to deliver a supply voltage to the second power supply voltage node equal to a greater one of the voltages at the first power supply voltage node, the one of the inputs and the output.

19. The circuit according to claim 18, wherein the voltage selection circuit comprises:

a PMOS extended-drain transistor having a gate, a source and a drain, the drain connected to the first power supply node;

a current source coupled to the gate;

a first diode coupled between the one of the inputs and the source;

a second diode coupled between the output and the source; and wherein the source is coupled to the second power supply voltage node.

* * * * *